(12) United States Patent
Closset

(10) Patent No.: US 8,913,190 B2
(45) Date of Patent: Dec. 16, 2014

(54) METHOD AND APPARATUS FOR REGENERATING A PIXEL CLOCK SIGNAL

(75) Inventor: Arnaud Closset, Cesson-Sevigne (FR)

(73) Assignee: Canon Kabushiki Kaisha, Tokyo (JP)

( * ) Notice: Subject to any disclaimer, the term of this patent is extended or adjusted under 35 U.S.C. 154(b) by 100 days.

(21) Appl. No.: 13/528,388

(22) Filed: Jun. 20, 2012

(65) Prior Publication Data
US 2013/0027611 A1 Jan. 31, 2013

(30) Foreign Application Priority Data

Jun. 21, 2011 (GB) .................................. 1110477.5

(51) Int. Cl.
H03L 7/00 (2006.01)
H04N 5/935 (2006.01)
(52) U.S. Cl.
CPC ..................... H04N 5/935 (2013.01)
USPC ............................ 348/537; 348/500; 348/536
(58) Field of Classification Search
USPC ......... 348/500, 501, 512, 513, 516, 521, 524, 348/536, 537
See application file for complete search history.

(56) References Cited

U.S. PATENT DOCUMENTS 5,596,420 A * 1/1997 Daum ............................ 386/241
6,021,168 A * 2/2000 Huh .............................. 375/376

2001/0043621 A1* 11/2001 Anderson et al. ............. 370/516
2005/0237429 A1* 10/2005 Grundmeyer et al. ........ 348/510
2009/0161809 A1 6/2009 Xiu et al.

FOREIGN PATENT DOCUMENTS

EP 1592245 A1 2/2005
WO 2007149784 A2 12/2007

OTHER PUBLICATIONS

Combined Search and Examination Report under Section 17 and 18(3) issued Sep. 29, 2011.

* cited by examiner

Primary Examiner — Jefferey Harold
Assistant Examiner — Michael Teitelbaum
(74) Attorney, Agent, or Firm — Canon USA, Inc., IP Division

(57) ABSTRACT

A method and device regenerating a pixel clock signal, the method comprising, and the device being configured for: determining a first drift value D1 representative of a first time difference between a reference clock signal RC and a local clock signal LC based on a local pixel clock signal LPC; adjusting the local pixel clock signal LPC according to an adjustment command to provide a regenerated pixel clock signal RPC; determining a second drift value D2 representative of a second time difference between the reference clock signal RC and a regenerated clock signal based on the regenerated pixel clock signal RPC; and providing the adjustment command to the adjustable clock generator 32; 132; 316 for adjusting the local pixel clock signal LPC, wherein the adjustment command is based on the difference between the determined first and second drift values.

15 Claims, 15 Drawing Sheets

METHOD AND APPARATUS FOR REGENERATING A PIXEL CLOCK SIGNAL

REFERENCE TO RELATED PATENT APPLICATION

This application claims the benefit under 35 U.S.C. §119 of the filing date of United Kingdom Patent Application No. 1110477.5, filed Jun. 21, 2011, hereby incorporated by reference in its entirety as if fully set forth herein.

The present invention relates to a method and an apparatus for regenerating a pixel clock signal. The invention further relates to a method and an apparatus for generating a video signal.

In a real time distribution system in which a video source device provides video data to a video display device for display, synchronization should be maintained between the captured input video stream, and the regenerated video stream of the display interface device. High Digital Multimedia Interface (HDMI) is widely used for video transmission between data source and data destination equipment. This type of communication interface applies a synchronous transmission mode, using a physical pixel clock reference signal to synchronize transmission of data, for example pixel values, and video timing information, for example start of frame, start of line, active lines period, and the like. In a wireless network transmission mode, it is often desirable to locally regenerate a video pixel clock at the display interface device before delivering video data to a HDMI interface. In order to maintain synchronization between a locally regenerated pixel clock at the display device and the initial source pixel clock of the data source device, it is also desirable to regularly apply some variations to the regenerated pixel clock value according to a frame rate drift measurement computed between source and regenerated video streams.

Some technical approaches use adjustable reference output clock generator components, based on PLL (Phase-Locked Loop) architecture for synchronisation purposes. Such components produce an output signal locally which maintains some pre-defined phase and frequency proportionalities relative to an input reference signal. Frequency based adjustment methods require either modifying the PLL's input to output frequency ratio configuration, or applying some period adjustments to the PLL's input reference. In the first case, such a solution implies temporarily stopping the PLL's output, while in the second case, significant output clock cycle alterations (depending on the correction gap) may be observed. Alternative methods of output clock phase step adjustment would create unstable output frequency during clock edges transitions.

A drawback of the above solutions, is that functions or modules in a display interface device which use a regenerated pixel clock would require a high level of robustness, in order to be capable firstly of supporting transient clock variations, and secondly of tolerating frequency variations. Such considerations prevent the use of low buffering architecture.

US2009/0161809 describes a method and apparatus for adjusting a frame rate, using a flying-adder synthesizer in addition to a conventional PLL. The output frequency is adjusted by reducing or increasing the period between two successive rising edges of a clock signal. While such a solution can help to smooth frequency adjustment, the low response time requires additional buffering to absorb a drift compensation period.

Another approach depicted in WO 2007/149784 proposes using a cascaded PLL scheme to perform frequency adjustments without creating transient output clock variations. The principle is to use a first PLL having a dynamic ratio setting capability, then cascading its output to a second PLL having fixed ratio settings. This solution has however some limitations: in addition to a very accurate input clock reference requirement, adjustment capability is limited to one period of reference input clock for every video source frame or line period, and is computed only following video stream connection establishment.

The present invention has been devised to address one or more of the foregoing concerns.

According to a first aspect of the invention there is provided a device for regenerating a pixel clock signal, the device comprising: first drift means for determining a first drift value representative of a first time difference between a reference clock signal and a local clock signal based on a local pixel clock signal; an adjustable clock generator for receiving the local pixel clock signal at an input and outputting a regenerated pixel clock signal according to the local pixel clock signal and a received adjustment command; second drift means for determining a second drift value representative of a second time difference between the reference clock signal and a regenerated clock signal based on the regenerated pixel clock signal; and an adjustment unit operable to provide the adjustment command to the adjustable clock generator for adjusting the regenerated pixel clock signal, wherein the adjustment command is based on the difference between the determined first and second drift values. Accordingly, a frame rate drift between a source node providing video data and a display node receiving video may be compensated for in a more accurate manner. The regenerated pixel clock signal may be continuously adjusted to provide a more accurate correspondence with the reference clock signal. Transitory phenomena of a local clock signal may be taken into account.

In an embodiment the first drift value and the second drift value may be each expressed as a number of local pixel clock cycles. In an embodiment the local clock signal is representative of a local frame rate of video data of a display processing device receiving the video data, and the reference clock signal is representative of a source frame rate of video data of a source device supplying the video data. The source frame rate reference may be for example indicated using timestamps from a common network clock period.

In a particular embodiment the adjustable clock generator is a phase locked loop device having a step phase adjustable capability responsive to the adjustment command for adjusting the time duration between rising or falling edges of the regenerated pixel clock signal. Accordingly the drift compensation may be more finely adjusted.

In one embodiment the device includes processing period modification means for modifying a video data processing period according to the first drift value.

In one embodiment the device includes local frame period modification means for modifying the period of a local frame of video data of the display device according to the first drift value.

In an embodiment the second drift means may be operable to determine the second drift value based on the difference a number of pixels of video data written by a display processing module and the number of pixels provided to a video display device over each video frame period.

A second aspect of the invention provides a video display apparatus for receiving video data from a remote source for display on a local display, the apparatus comprising a display device for displaying video data pixel by pixel at a rate in accordance with a regenerated pixel clock signal; and a device according to the first aspect of the invention for providing the regenerated pixel clock signal to the display device.

A third aspect of the invention provides a method of regenerating a pixel clock signal, the method comprising: determining a first drift value representative of a first time difference between a reference clock signal and a local clock signal based on a local pixel clock signal; adjusting the local pixel clock signal according to an adjustment command to provide a regenerated pixel clock signal; determining a second drift value representative of a second time difference between the reference clock signal and a regenerated clock signal based on the regenerated pixel clock signal; and providing the adjustment command to the adjustable clock generator for adjusting the local pixel clock signal, wherein the adjustment command is based on the difference between the determined first and second drift values.

In a particular embodiment the first drift value and the second drift value are each expressed as a number of local pixel clock cycles.

In one embodiment the local clock signal is representative of a local frame rate of video data of a display device receiving the video data, and the reference clock signal is representative of a source frame rate of video data of a source device supplying the video data.

In an embodiment the local pixel clock signal is adjusted using a phase locked loop device having a step phase adjustable capability responsive to the adjustment command for adjusting the time duration between rising or falling edges of the regenerated pixel clock signal.

In an embodiment the method may further include modifying a video data processing period according to the first drift value.

In an embodiment the method may further include modifying the period of a local frame according to the first drift value.

In an embodiment the method may further include the second drift value may be determined based on the difference a number of pixels of video data written by a display processing module and the number of pixels provided to a video display device over each video frame period.

A fourth aspect of the present invention provides a device for generating a video signal adapted to be displayed on a display device, the device comprising:

first drift means for determining a first drift value representative of a first time difference between a reference clock signal and a local clock signal, the local clock being based on a local pixel clock signal;

a first correction means for adjusting the local pixel clock signal, to provide a first corrected local clock signal, by performing a first adjustment based on the first drift value;

a second correction means for correcting the local pixel clock signal, to provide a second corrected local clock signal by performing a second adjustment based on the first drift value; and processing means for processing the video signal to be delivered to the display device wherein the first adjustment is different from the second adjustment and the processing means is operable to synchronize processing of the video signal with the first corrected local clock signal and to control the display rate by a control signal synchronized with the second corrected local clock signal.

Accordingly, a stable local clock may be provided for internal processing and a stable regenerated clock signal for controlling display of video data may be provided.

In an embodiment the first adjustment comprises adjusting the number of local pixel clock periods based on the first drift value and the second adjustment comprises adjusting the period duration of the local pixel clock signal based on the first drift value.

In an embodiment the second correction means comprises an adjustable clock generator for receiving the local pixel clock signal at an input and outputting a regenerated pixel clock signal according to the local pixel clock signal and a received adjustment command; and an adjustment unit operable to provide the adjustment command to the adjustable clock generator for adjusting the regenerated pixel clock signal, wherein the adjustment command is based on at least the determined first drift value.

In an embodiment the second correction means comprises second drift means for determining a second drift value representative of a second time difference between the reference local clock signal and a regenerated clock signal based on the regenerated pixel clock signal; and wherein the adjustment command is based on the difference between the determined first and second drift values.

A fifth aspect of the present invention provides a video display apparatus for receiving video data from a remote source for display on a local display, the apparatus comprising a display device for displaying video data pixel by pixel at a display rate controlled by a control signal synchronized according to a second corrected clock signal; and a device according to the fourth aspect of the invention for providing the second corrected clock signal to the display device.

According to a sixth aspect of the invention there is provided a method for generating a video signal adapted to be displayed on a display device, the method comprising: determining a first drift value representative of a first time difference between a reference clock signal and a local clock signal based on a local pixel clock signal; adjusting the local pixel clock signal by performing a first adjustment based on the first drift value to provide a first corrected local clock signal; correcting the local pixel clock signal by performing a second adjustment based on the first drift value to provide a second corrected local clock signal; and processing the video signal to be delivered to the display device; wherein the first adjustment is different to the second adjustment and processing of the video signal is synchronized with the first corrected local clock signal and a control signal for controlling the display rate is synchronized with the second corrected local clock signal.

In an embodiment the first adjustment comprises adjusting the number of local pixel clock periods based on the first drift value and the second adjustment comprises adjusting the period duration of the local pixel clock signal based on the first drift value.

In an embodiment correcting the local pixel clock signal comprises regenerating a pixel clock signal according to the local pixel clock signal and a received adjustment command; and providing the adjustment command for adjusting the regenerated pixel clock signal, wherein the adjustment command is based on at least the determined first drift value.

In an embodiment the method further includes determining a second drift value representative of a second time difference between the reference local clock signal and a regenerated clock signal based on the regenerated pixel clock signal; and providing an adjustment command is based on the difference between the determined first and second drift values.

According to a seventh aspect of the invention there is provided a video data distribution system comprising a video display apparatus according to the second aspect or the fifth aspect of the invention, and a video source data device for providing video data and a reference clock signal to the video display apparatus.

At least parts of the methods according to the invention may be computer implemented. Accordingly, the present invention may take the form of an entirely hardware embodiment, an entirely software embodiment (including firmware, resident software, micro-code, etc.) or an embodiment combining software and hardware aspects that may all generally be referred to herein as a "circuit", "module" or "system". Furthermore, the present invention may take the form of a computer program product embodied in any tangible medium of expression having computer usable program code embodied in the medium.

Since the present invention can be implemented in software, the present invention can be embodied as computer readable code for provision to a programmable apparatus on any suitable carrier medium. A tangible carrier medium may comprise a storage medium such as a floppy disk, a CD-ROM, a hard disk drive, a magnetic tape device or a solid state memory device or the like. A transient carrier medium may include a signal such as an electrical signal, an electronic signal, an optical signal, an acoustic signal, a magnetic signal or an electromagnetic signal, e.g. a microwave or RF signal.

Embodiments of the invention will now be described, by way of example only, and with reference to the following drawings in which.

Figure 1:
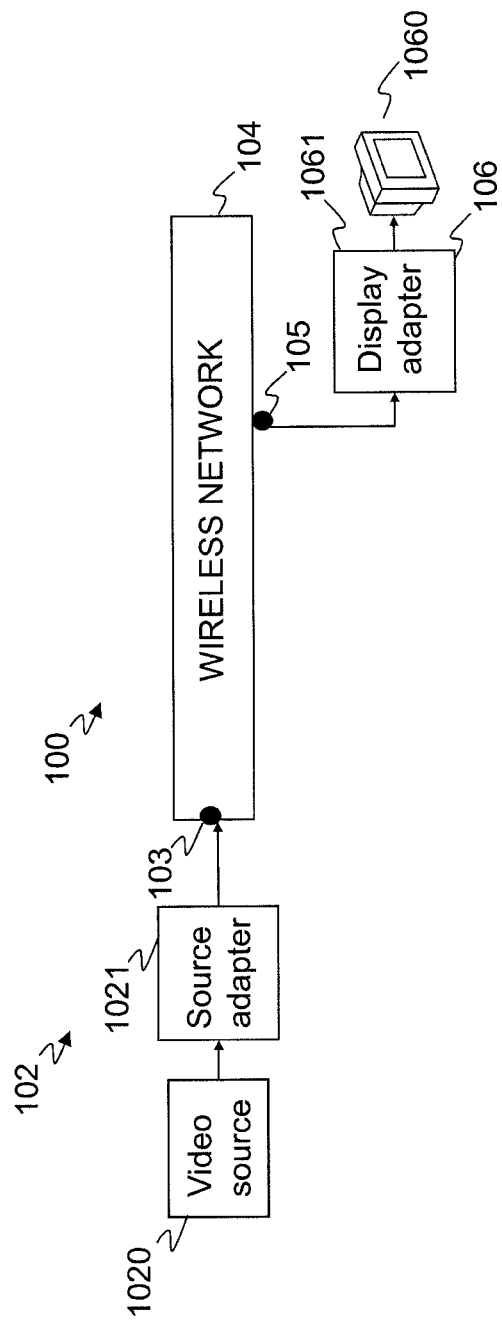
FIG. 1 is a schematic diagram of a wireless communication network in which one or more embodiments of the invention may be implemented.

FIG. 1 illustrates a wireless data distribution system 100 in which one or more embodiments of the invention may be implemented. The wireless distribution system 100 enables streaming of video data to be performed between a video source device 102 and a remote video display device 106 via a wireless network 104. The wireless network 104 is a synchronous type wireless network 104, having a transmission latency between access points. This latency may be expressed as a multiple integer of network reference periods, often referred to as TDM cycles. Two network access points 103 and 105 are provided for the video source device 102 and the video display device 106 respectively. The video source device comprises a video data source device 1020 and a source adapter device 1021. The source adapter device 1021 is connected to access point 103, and receives video application data from the video data source device 1021. The video display device 106 comprises a video display 1060 and a display adapter device 1061. The display adapter device 1061 is connected to access point 105, and transfers video application data to the video display 1060.

Figure 2:
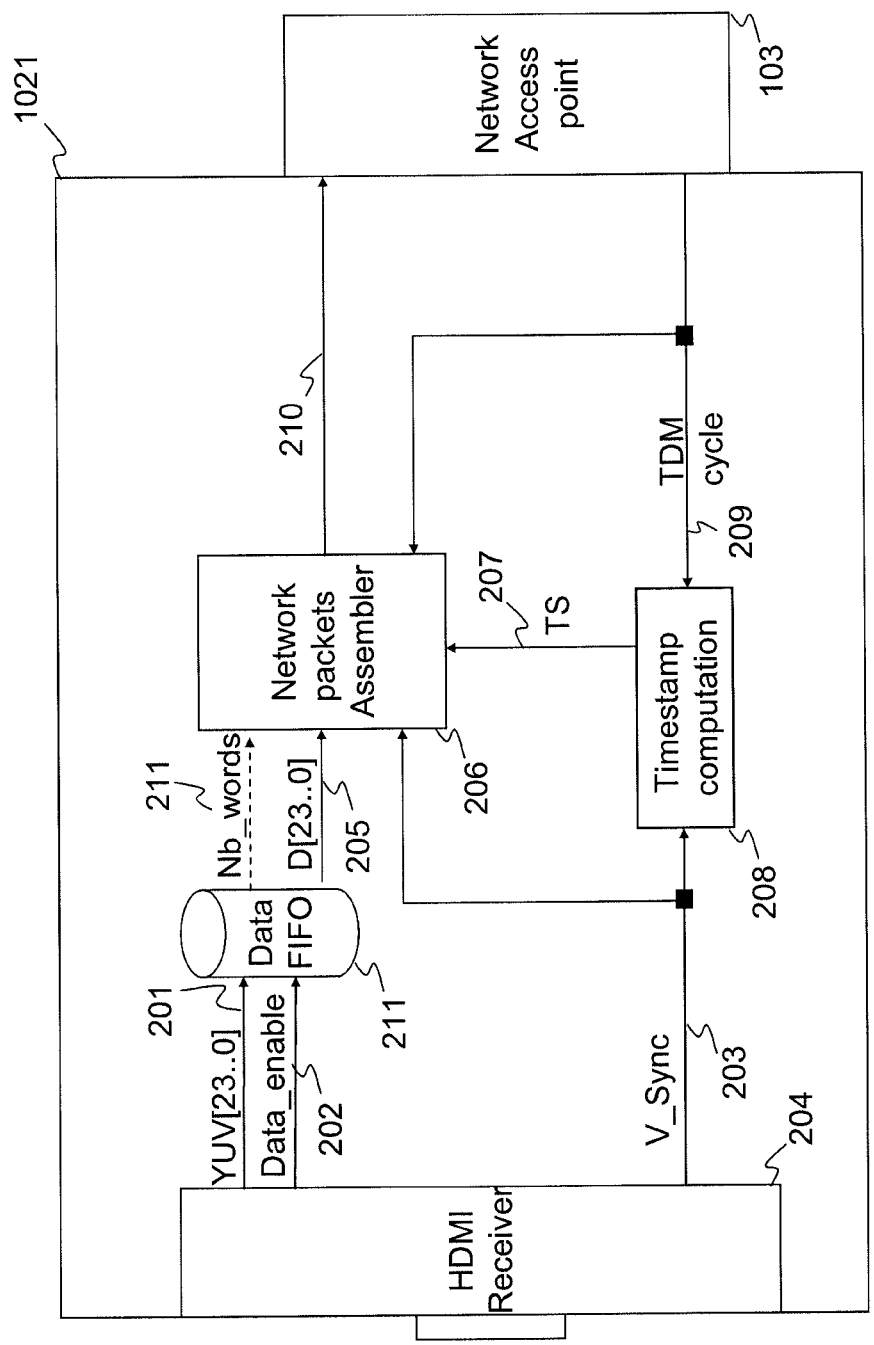
FIG. 2 is a schematic block diagram of a video source device according to at least one embodiment of the invention.

FIG. 2 schematically illustrates an example of the architecture implemented in source adapter 101. The source adapter 101 comprises an HDMI receiver 204, a data FIFO buffer 211, a timestamp computation engine 208, and a Network packet assembler 206. Video data application received from source 102 is delivered to a YUV data interface 201, and data is written in FIFO buffer 211 according to a Data_enable signal 202 received from the HDMI receiver 204. Start of frame signal V_sync 203 is provided to timestamp computation engine 208, which timestamps V_sync events relative to a TDM_cycle signal 209 generated by network access point 103. Computed TS timestamp value 207 is then delivered to network packets assembler 206 which formats network packets 210 containing video data previously stored in FIFO 211 and timestamp information.

Figure 3:
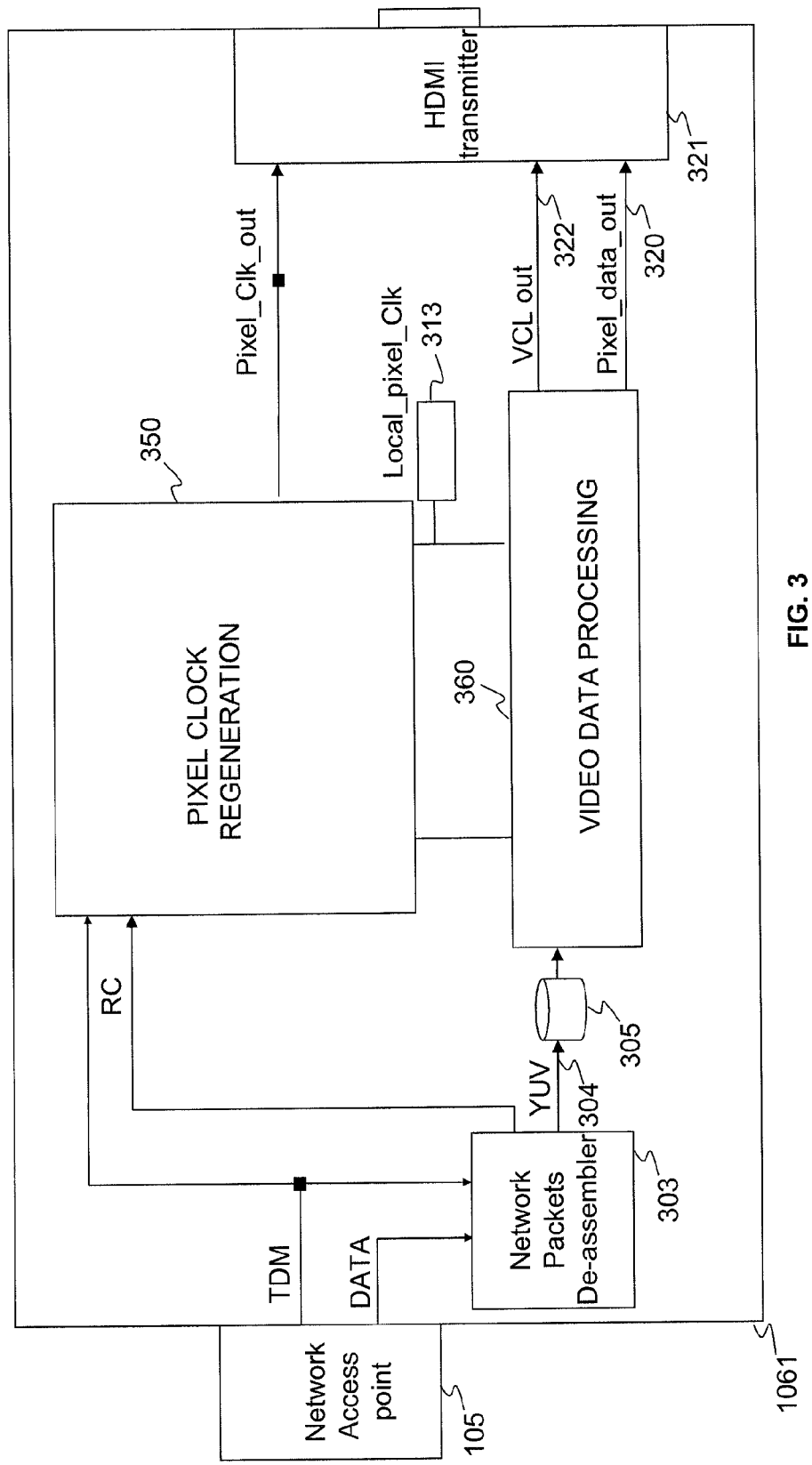
FIG. 3 is a schematic block diagram of a video display adapter device according to at least one embodiment of the invention.

FIG. 3 schematically illustrates an example of architecture implemented in display adapter 1061 according to at least one embodiment of the invention. The display adapter 1061 receives timing signals TDM (Time Division Multiplex) and data packets DATA from a video data source device via Network access point 105. Time stamps used in the calculation of drift values can be expressed with reference to TDM indexes provided by the received TDM signals. Pixel Data signals Pixel_data_out, video control signals VCL and regenerated pixel clock signals Pixel_Clk_Out are output to HDMI transmitter 321. The display adapter 106 includes a network packet de-assembler module 303 for de-multiplexing received data traffic DATA from Network access point 105 and for storing YUV information in a buffer 305. Concurrently, TS events 306 are provided to a pixel clock regeneration device 350 as a reference clock signal RC. The display adapter 1061 further includes a video data processing module 360, for post-processing data from buffer 305. Video data processing module provides video control signals VCL, video data signals and Pixel_Data_Out to HDMI transmitter 321.

The display adapter further includes a local oscillator generating a Local_pixel_Clk signal 313 to be adjusted by pixel clock regeneration device 350 to generate the regenerated pixel clock signal Pixel_clk_out.

The HDMI transmitter 321 delivers the video control signals 322, the video data signals 320 and the Pixel_Clk_out signal 323 to video display 1060 of FIG. 1, via a HDMI interface for display of the video data.

Figure 4A:
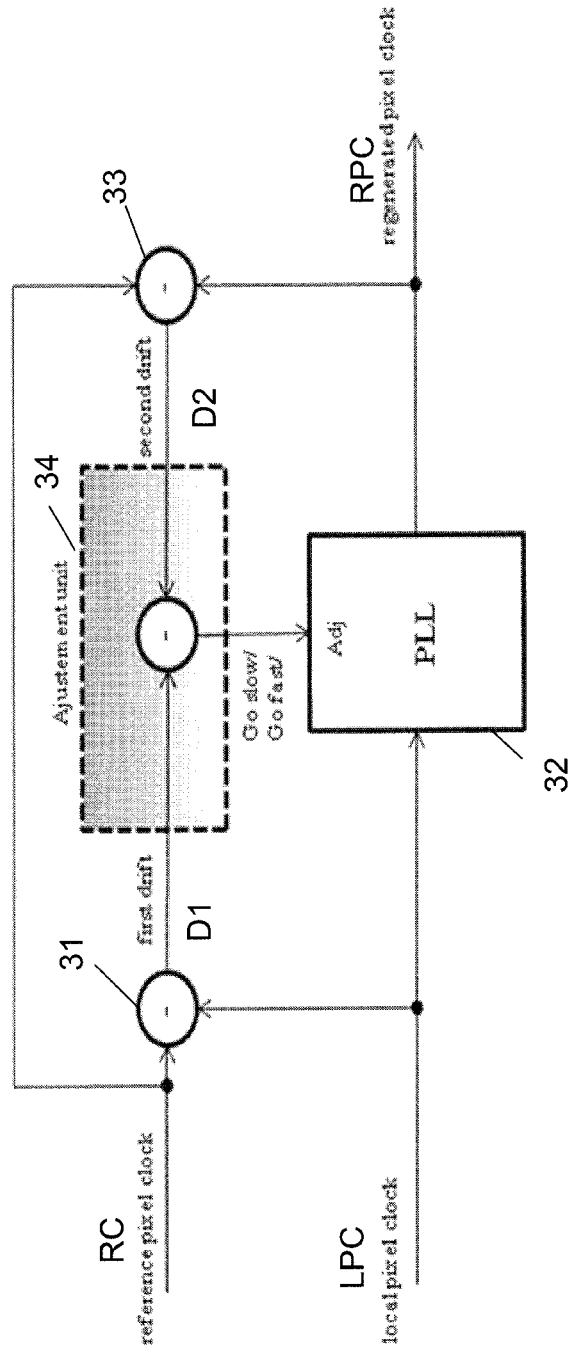
FIG. 4A is a schematic block diagram of elements of device for regenerating a pixel clock signal according to a first embodiment of the invention.

FIG. 4A is a schematic block diagram of components of a device for regenerating a pixel clock signal in accordance with a first embodiment of the invention. The device for regenerating a pixel clock signal which performs the function of adjusting a local pixel clock signal according to a reference time signal is included in the display adapter of FIG. 3. The reference clock signal is provided by the source adapter 1021 as a source frame rate reference. The pixel clock signal is regenerated based on the source frame rate reference signal. Referring to FIG. 4A the device for regenerating the clock signal comprises a first drift computation module 31 for determining a first drift value representative of a first time difference between the reference source clock signal RC and a local pixel clock signal LPC, and an adjustable clock generator 32 for receiving the local pixel clock signal LPC at an input and outputting a regenerated pixel clock signal RPC according to the local pixel clock signal LPC and a received adjustment command. In this embodiment of the invention the adjustable clock generator comprises a Phase Locked Loop (PLL) module 32. The device further comprises a second drift computation module 33 for determining a second drift value D2 representative of a second time difference between the reference clock signal RC and the regenerated pixel clock signal RPC; and an adjustment unit 34 operable to provide the adjustment command to the adjustable clock generator 32 for adjusting the local pixel clock signal LPC to provide regenerated pixel clock signal RPC. The adjustment command is based on the difference between the determined first and second drift values D1, D2 provided by the first drift computation module 31 and the second drift computation module 33, respectively. The PLL module 32 has a step phase adjustment capability and applies a phase shift to increase or decrease the time duration between rising edges of the regenerated clock signal RLC, according to the adjustment command. The adjustment command comprises a Go Fast/Go Slow signal. Each time the Go_fast/slow command signal indicates Go_fast, a phase shift of a pre-determined step is applied to reduce the time to the next rising edge of the regenerated pixel clock signal RPC. Each time the Go_fast/slow signal indicates Go_slow, a phase shift of a pre-determined step is applied to increase the time to the next rising edge of regenerated pixel clock output signal. When no indication is active, the regenerated pixel clock output signal period follows the local pixel clock signal waveform.

Thus the general concept of the first embodiment is to use a dual drift compensation apparatus in a display interface. A first drift compensation module compares the difference between a local frame rate generator using a local pixel clock and the source frame rate reference indicated for example using timestamps from a common network clock period. The local pixel clock LPC drives the input of a phase-jump adjustable PLL module in charge of regenerating an external pixel clock RPC.

From this first difference, a pre-determined internal frame rate correction scheme is applied, independently of the output of the PLL module. Advantageously, the performance of a video display interface device is influenced by a pre-determined internal drift correction scheme. Concurrently, a second drift is computed from external PLL's output clock and internal frame rate adjustments. The, first and second drifts are aggregated to adjust PLL's output signal. Advantageously, adjustments of the PLL module are transparent to internal processing, while effective PLL output variations are monitored back for computing next adjustment.

Accordingly a frame rate drift between the source node 101 and the display node 106 may be compensated. Measuring the drift between the reference clock signal RC and the regenerated clock signal RPC enables transitional phenomena of the regenerated clock to be compensated for. Calculation of the second drift value D2 can be carried out over duration of time of longer duration compared to that of the pixel clock periods in order to observer the mean shift between the reference clock signal and the regenerated pixel clock signal. The PLL module 32 enables the regenerated clock signal RPC to be finely adjusted.

Figure 4B:
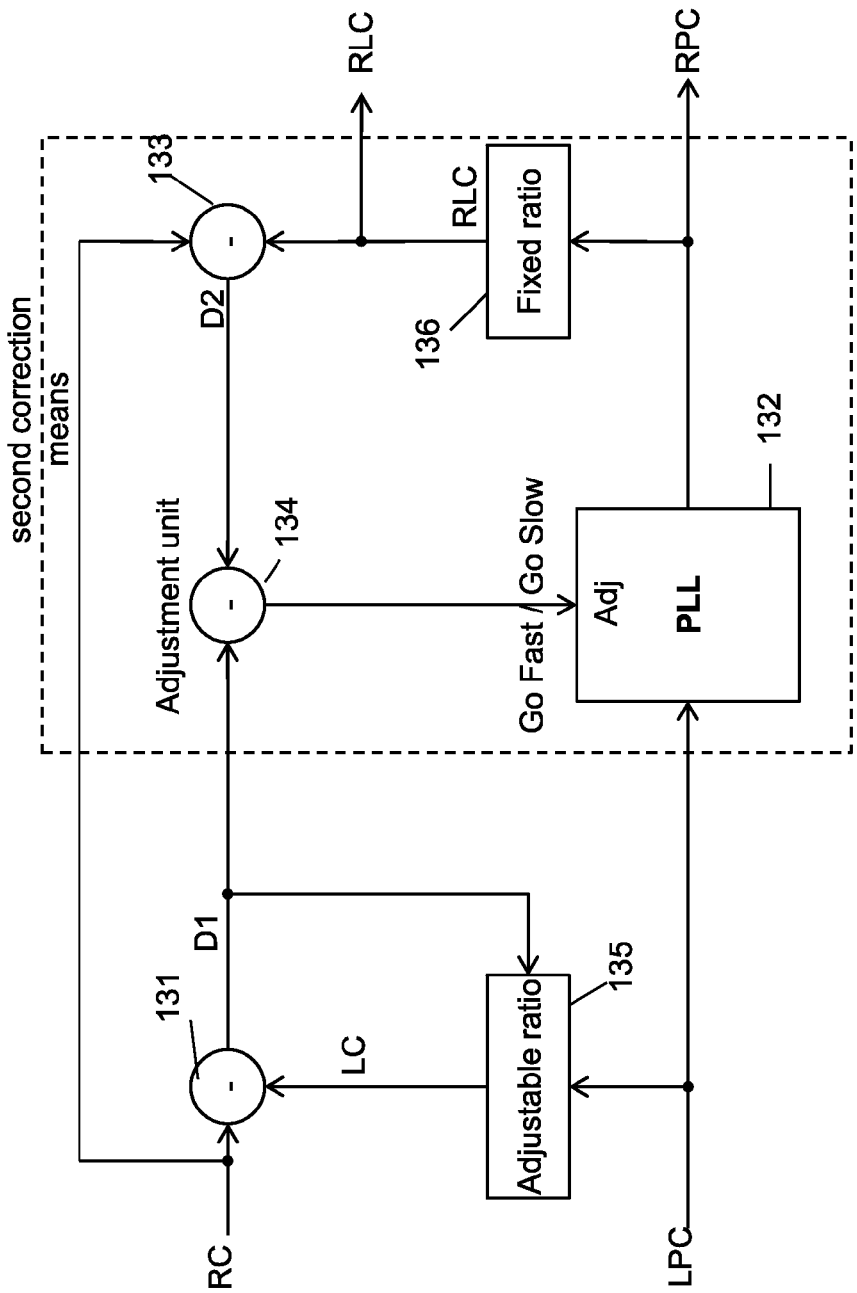
FIG. 4B is a schematic block diagram of elements of device for regenerating a pixel clock signal according to a second embodiment of the invention.

FIG. 4B is a schematic block diagram of components of a device for regenerating a pixel clock signal in accordance with a second embodiment of the invention. The device for regenerating a pixel clock signal according to the second embodiment of the invention performs the function of adjusting a local pixel clock signal according to a reference time signal and is included in the display adapter of FIG. 1. The reference clock signal is provided by the source adapter 1021 as a source frame rate reference. The pixel clock signal is regenerated based on the source frame rate reference signal. Referring to FIG. 4B the device for regenerating the clock signal comprises a first drift computation module 131 for determining a first drift value D1 representative of a first time difference between the reference source clock signal RC and an adjusted local clock signal LC. A local clock signal adjuster module 135 adjusts a local pixel clock signal LPC according to the first drift value D1. The role of the local clock signal adjuster module 135 is to provide a first corrected local clock signal LC for internal processing, and to subtract the first drift value from the local pixel clock signal LPC to avoid its propagation when calculating the first drift value D1 of the subsequent iteration. By applying an adjustable ratio the number of local pixel clock periods may be adjusted according to the first drift value D1. The device further includes an adjustable clock generator 132 for receiving the local pixel clock signal LPC at an input and outputting a regenerated pixel clock signal RPC according to the local pixel clock signal LPC and a received adjustment command. In this embodiment of the invention the adjustable clock generator comprises a Phase Locked Loop (PLL) module 132. A second drift computation module 133 is provided for determining a second drift value D2 representative of a second time difference between the reference clock signal RC and a regenerated clock signal RLC based on the regenerated pixel clock signal RPC. An adjustment unit 134 is included in the device to provide the adjustment command to the adjustable clock generator 132 for adjusting the regenerated pixel clock signal RPC. The adjustment command is based on the difference between the determined first D1 and second D2 drift values provided by the first drift computation module 131 and the second drift computation module 133, respectively. The PLL module 132 has a step phase adjustment capability and applies a phase shift to increase or decrease the time duration between rising edges of the regenerated pixel clock signal RPC, according to the adjustment command. The adjustment command comprises a Go Fast/Go Slow signal. Each time the Go_fast/slow command signal indicates Go_fast, a phase shift of a pre-determined step is applied to reduce the time to the next rising edge of the regenerated pixel clock signal RPC. Each time the Go_fast/slow signal indicates Go_slow, a phase shift of a pre-determined step is applied to increase the time to the next rising edge of regenerated pixel clock output signal. When no indication is active, the regenerated pixel clock output signal period follows the local pixel clock signal waveform.

The device also includes a second adjuster 136 for providing the regenerated local clock signal RLC according to adjustment of the regenerated pixel clock signal RPC. Consequently, a regenerated pixel clock signal RPC and a second corrected local regenerated clock signal RLC are provided.

Accordingly a video signal for display device 1060 may be resynchronised by taking into account different processing objectives or constraints. A buffer 305 providing the video stream may be managed such that it does not empty or overflow during delivery of the video stream. This embodiment of the invention helps to provide a local pixel clock signal with stable periods and which may be corrected over a longer duration of time, for example the duration of time corresponding to a line of a video image. The correction may adjust the local pixel clock signal by a negligible number of pixel clock periods. The local pixel clock signal or the local clock signal based on the local pixel clock signal control the internal processing of the video signal (decoding etc).

This embodiment further helps to provide a regenerated clock signal for which the period duration do not have to be stable but for which the number of periods for a given duration of time (typically corresponding to the line of an image) should be fixed. The regenerated pixel clock signal may then be used to control a display for displaying the video data.

Figure 4C:
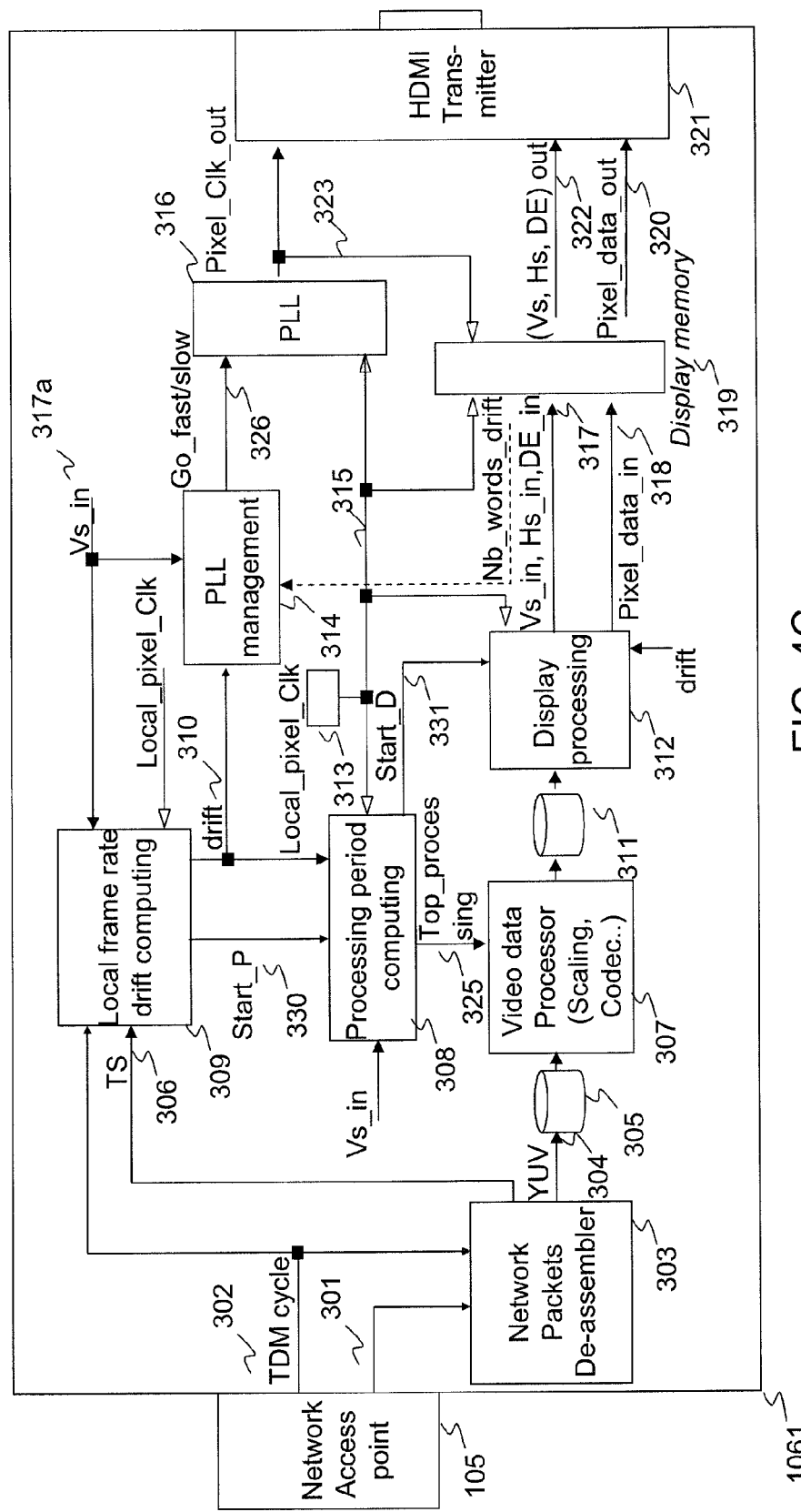
FIG. 4C is a schematic block diagram of elements of video receiver device of according to a third embodiment of the invention.

FIG. 4C schematically illustrates an example of the overall architecture of display adapter 106 according to a third embodiment of the invention. The display adapter 106 receives Time Division Multiplex timing signal TDM 302 and data packets DATA 301 from the video data source 102 device via Network access point 105. The display adapter 106 includes a network packet de-assembler module 303 for de-multiplexing received data traffic 301 from Network access point 105. First type of information 304 (pixel payload data YUV) is stored in a buffer 305. Second type of information TS events 306 (also called reference clock signal) are provided to a local frame rate drift computing module 309 (also called first drift computing means) which also receives TDM signal 302. Time stamps used in the calculation of drift values can be expressed with reference to TDM indexes provided by the received TDM signal. A video data processor module 307 is provided for post-processing data from buffer 305, in response to Top_processing events signal 325 (also called first corrected local clock signal) generated by a processing period computing function 308, and for writing corresponding data transformation to a second buffer 311. Top_processing events 325 are nominally generated from a local pixel clock signal 313 and adjusted in reference to events Vs_in 317*a* (also called local clock signal) generated by module 312. Function 308 and module 307 are called reference processing means of video signal contained in buffer 305.

The display adapter 106 further includes a local oscillator for generating a Local_pixel_Clk signal 313 (also called local pixel clock signal), a Phase Locked Loop (PLL) 316 for regenerating an external Pixel_Clk_out signal 323 from Local_pixel_Clk signal 313. The PLL 316 has a step phase adjustment capability in response to a Go_fast/slow input command signal 326 generated by a PLL management module 314 (also called second correction means). Each time the Go_fast/slow command signal 326 indicates Go_fast, a phase shift of a pre-determined step (for example 12.5 degrees) is applied to reduce the next rising edge of the Pixel_Clk_out 323 output signal. Each time Go_fast/slow indicates Go_slow, a phase shift of a pre-determined step (for example 12.5 degree) is applied to increase the next rising edge of Pixel_Clk_out 323 output signal. When no indication is active, the Pixel_clk_out period follows the Local_pixel_clk 313 waveform.

The local frame rate drift computing module 309 constitutes a first drift computational module which computes a first time difference or drift 310 (also called first drift value) expressed in number of periods of signal Local_pixel_Clk 313, from the content of signal TS 306 and signal Vs_in events 317*a* generated by an internal frame display processing module 312 in charge of provided processed video data 318 retrieved from buffer 311 to a display memory buffer 319, and to adjust local frame timing signals 317*a* generated from Local_pixel_Clk 313, using drift values 310 information.

The display adapter 106 further includes a processing period computing module 308 for generating the Top_processing events 325 signal as a number of periods of signal Local_pixel_Clk 313 from the signal Vs_in events 317*a* and first drift signal 310.

Display memory 319 comprises a dual-ports display memory, one port being written by display processing module 312, the other port generating display content from Pixel_Clk_out signal 323. This module is also configured to provide a signed integer value Nb_words_drift 315 (also called second drift value) representing the difference between the number of pixels written by Display processing module 312 and the number of pixels provided to HDMI transmitter 321, over each period of Vs_in event 317. The value Nb_words_drift 315 constitutes a second drift value representative of a time difference between the reference local clock signal Vs_in 317*a* of the display adapter a regenerated clock signal Vs_out 322*a* (also called second corrected local clock signal) based on the regenerated pixel clock signal 323 provided by PLL module 316.

The display adapter 106 further includes a HDMI transmitter 321 for providing video control signals 322, video data 320 and Pixel_Clk_out signal 323 to display 1060 of FIG. 1, using a HDMI interface.

Figure 5A:
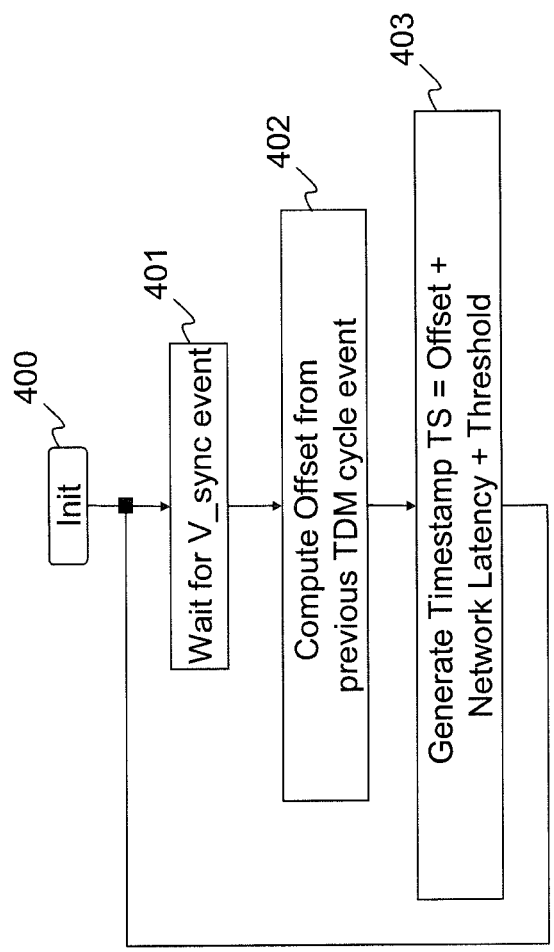
FIG. 5A is a flow chart illustrating steps of a method for computing a time stamp in a video source device according to at least one embodiment of the invention.

FIG. 5A is a flow chart illustrating steps of an algorithm implemented in the time stamp computation module 208 of the source adapter device 1021. After an initialisation state 400, a wait is performed in step 401 until a V_sync event 203 is received. Once a V_sync event 203 is received, the time difference between the last TDM_cycle event 209 and the V_sync event 203 just received is computed as an Offset value, in step 402. Next, in step 403, a timestamp is computed as the sum of the Offset value, a Network pre-defined latency expressed as an integer number of TDM cycles, and a constant threshold value also expressed as an integer number of TDM cycles. The generated time stamp TS is provided to network packets assembly module 206 once computed. The threshold is then added to take into account the time necessary for ensuring enough data will be available in a display interface device before starting any video post-processing.

Figure 5B:
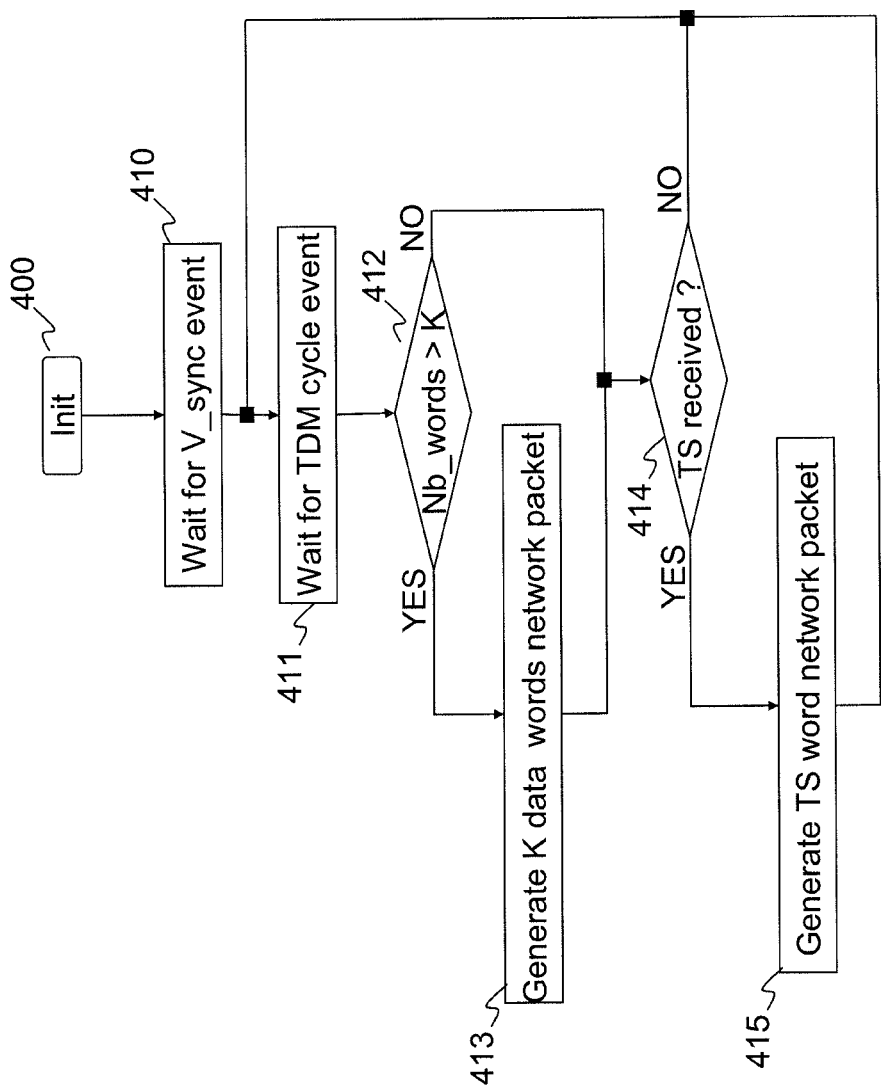
FIG. 5B is a flow chart illustrating steps of a method for formatting network packets according to at least one embodiment of the invention.

FIG. 5B is a flow chart illustrating steps of an algorithm implemented in network packet formatting module 206 of the source adapter device 102. After an initialisation state 400, a wait is performed in step 410 until a V_sync event 203 is received. Once a V_sync event 203 is received a wait is performed in step 411 until the next TDM cycle event 209 is received. Once the next TDM cycle event 209 is received, a test 412 is performed to compare the number of words available in the FIFO buffer 211 with a pre-defined number of words K allocated for network data packets size. If at least K words are available in the FIFO buffer 211, then a network data packet of K words is sent to the Network access point 103, before reaching test step 414. If the number of words in the FIFO buffer 211 is lower than K, then the test step 414 is directly reached.

In test step 414, a test is performed to check if a TS event 207 has been received from timestamp computation module 208. If it is the case that a TS event 207 has been received, a network control packet containing TS information is sent to the access point 103 before returning to wait state 411. If a TS event 207 has not been received, then the process returns directly to wait state 411.

Figure 6:
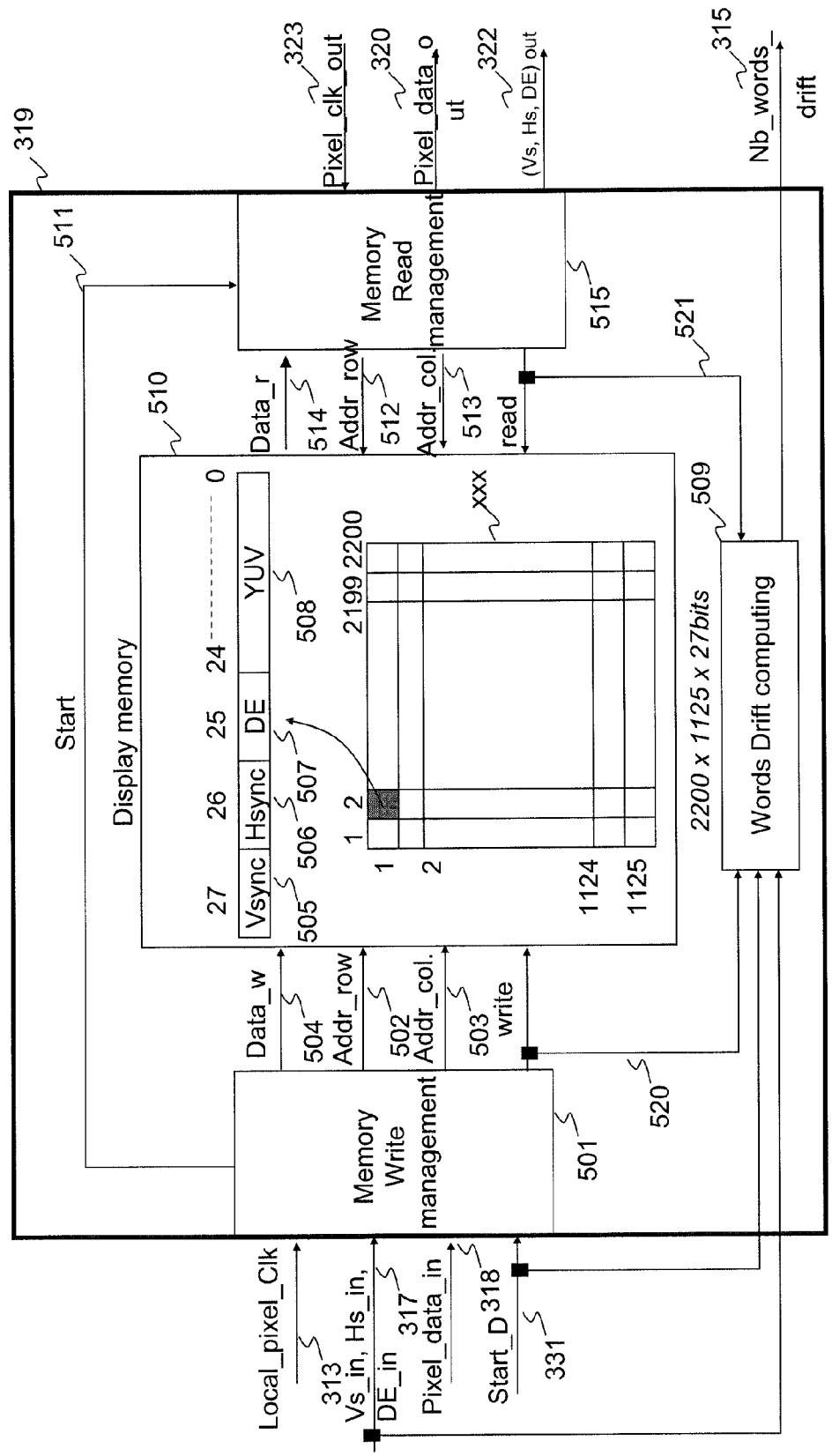
FIG. 6 is a schematic diagram of elements of display memory buffer device according to at least one embodiment of the invention.

FIG. 6 illustrates an example of the display memory buffer architecture in the display adapter 1061 according to an embodiment of the invention. The architecture includes a memory write management unit 501, a memory read management unit 512, a word drift computing module 509, and a display memory structure 510.

The display memory 510 comprises a memory structure organized in 1125 rows by 2200 columns of 27 bits size elements. Such a size corresponds in this embodiment to a full 1080 p video frame size, with respect to the CEA-861D standard. The memory write management unit processing 501 provides a Data_w signal 504. Each Data_w signal 504 written to display memory 510 corresponds to the concatenation of Vs_in, Hs_in, DE_ of signal structure 317 of FIG. 4C and Pixel_data_in YUV information 318 for each Local_pixel_Clk event 313. Write address management will be described in more detail with reference to FIG. 7A. Concurrently, Memory read management unit 515 demultiplexes Data_r concatenated information 514 to Pixel_data_out information 320, and (Vs, Hs, DE) out structure 322, on each Pixel_clk_out event 323. Read address management will be described in more detail with reference to FIG. 7B.

The Word drift computing module 509 is configured to compute the signed difference Nb_words_drift 315, between the number of write events 520 and the number of read events 521, between two successive Vs_in events in structure 317.

Figure 7A:
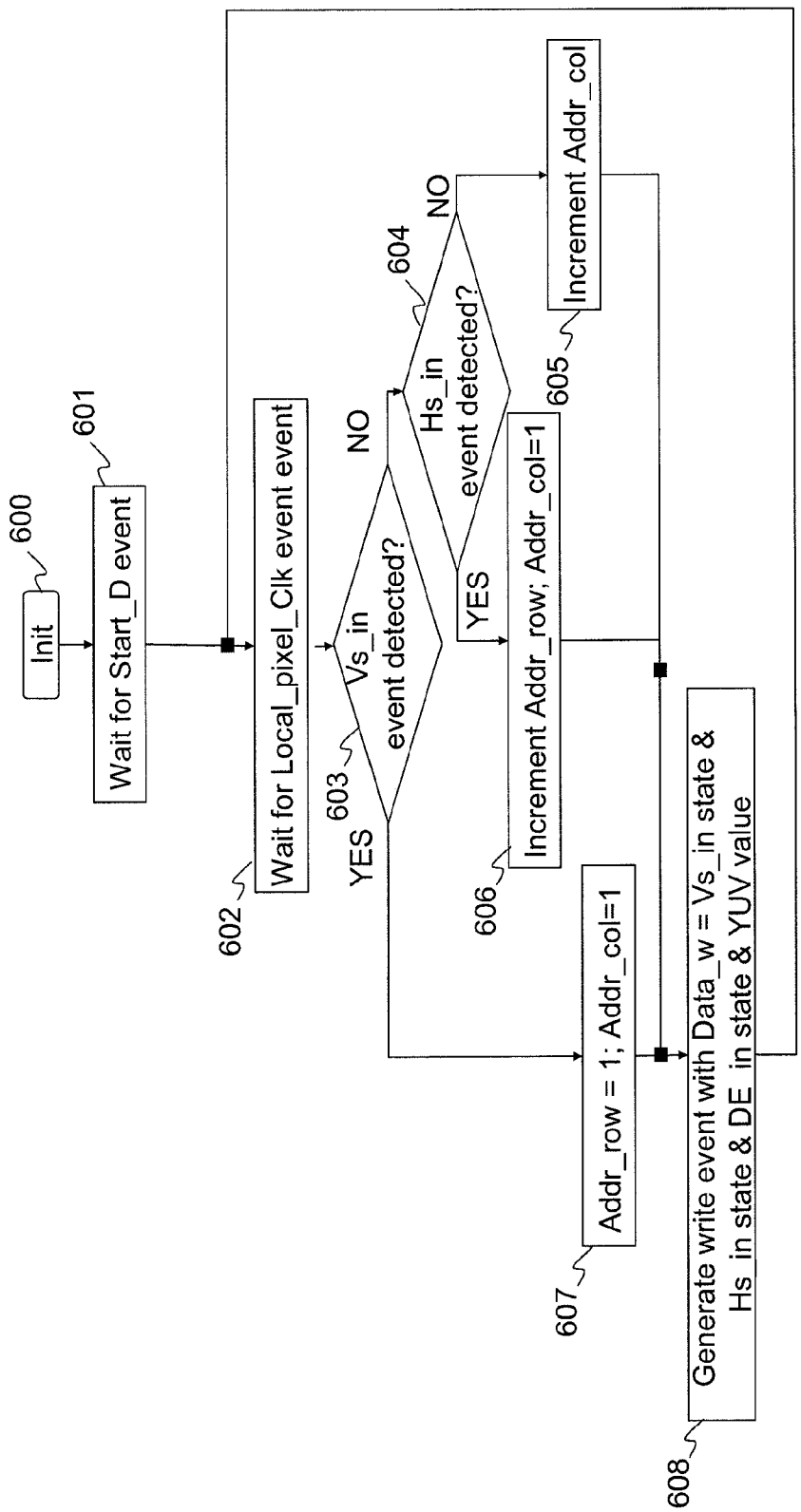
FIG. 7A is a flow chart illustrating steps of a method of memory write management according to at least one embodiment of the invention.

FIG. 7A is a flow chart illustrating steps of an algorithm implemented in the memory write management unit 501 of memory buffer architecture 319 of FIG. 4C. After an initialisation state 600, a wait is performed in step 601 until a Start_D event 331 is received. Once received, a wait is performed in step 602 until the next Local_pixel_Clk event 313 is received. Once the Local_pixel_Clk event 313 is received, a test step 603 is performed to check if a Vs_in event (i.e. the start of a frame) in signal structure 317 including signals Vs_in, Hs_in, DE_in has occurred. If yes a Vs_in event has occurred, row and column write addresses of memory structure 510 are reset to one, and the corresponding memory content is filled with Data_w 504 in step 608, before returning to wait state 602. If no, a Vs_in event has not occurred, a subsequent test 604 is performed to check if an Hs_in event (i.e. start of line) in signal structure 317 has occurred. If yes, an Hs_in event has occurred the row address is incremented, the column address is reset to one and the corresponding memory content is filled with Data_w 504 in step 608, before returning to wait state 602. If no, an Hs_in event has not occurred the column address is incremented, and the corresponding memory content is filled with Data_w 504 in step 608, before returning to wait state 602.

Figure 7B:
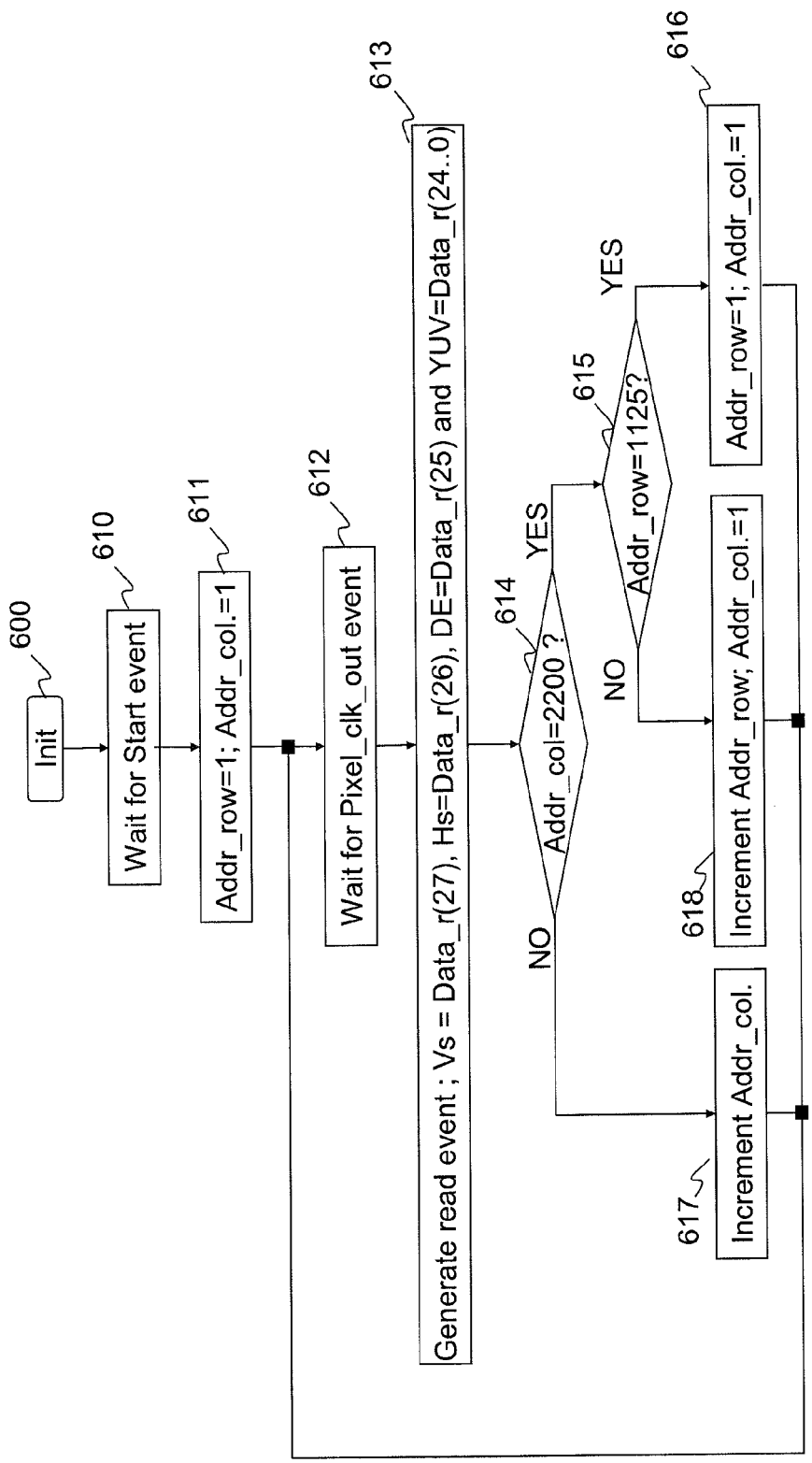
FIG. 7B is a flow chart illustrating steps of a method of memory read management according to at least one embodiment of the invention.

FIG. 7B is a flow chart illustrating steps of an algorithm implemented in the memory read management unit 515 of memory buffer architecture 319. After an initialisation state 600, a wait is performed in step 610 until a Start event 511 is received. Once a start event 511 is received, row and column read addresses are reset to one in step 611, and a wait is performed in step 612 until the next Pixel_clk_out event 323 is received. Once a Pixel_clk_out event 323 is received, Pixel_data_out value 320 and (Vs, Hs, DE) out structure 322 are filled from Data_r 514 content, in a step 613, before a test step 614 is performed to check if the current column address is the last one for the current line. If yes, the current column address is the last address for the current line a subsequent test 615 is performed to check if the current line address is the last one for the current frame. If yes, the current line address is the last one for the current frame, the row and column addresses are reset to one in step 616, before returning to wait step 612. If no, the current line address is not the last one for the current frame, the row address is incremented and the column address is reset to one in step 618, before returning to wait state 612. If in test step 614 the current column address is not the last column address for that line the column address is incremented in step 617, before returning to wait state 612.

Figure 8A:
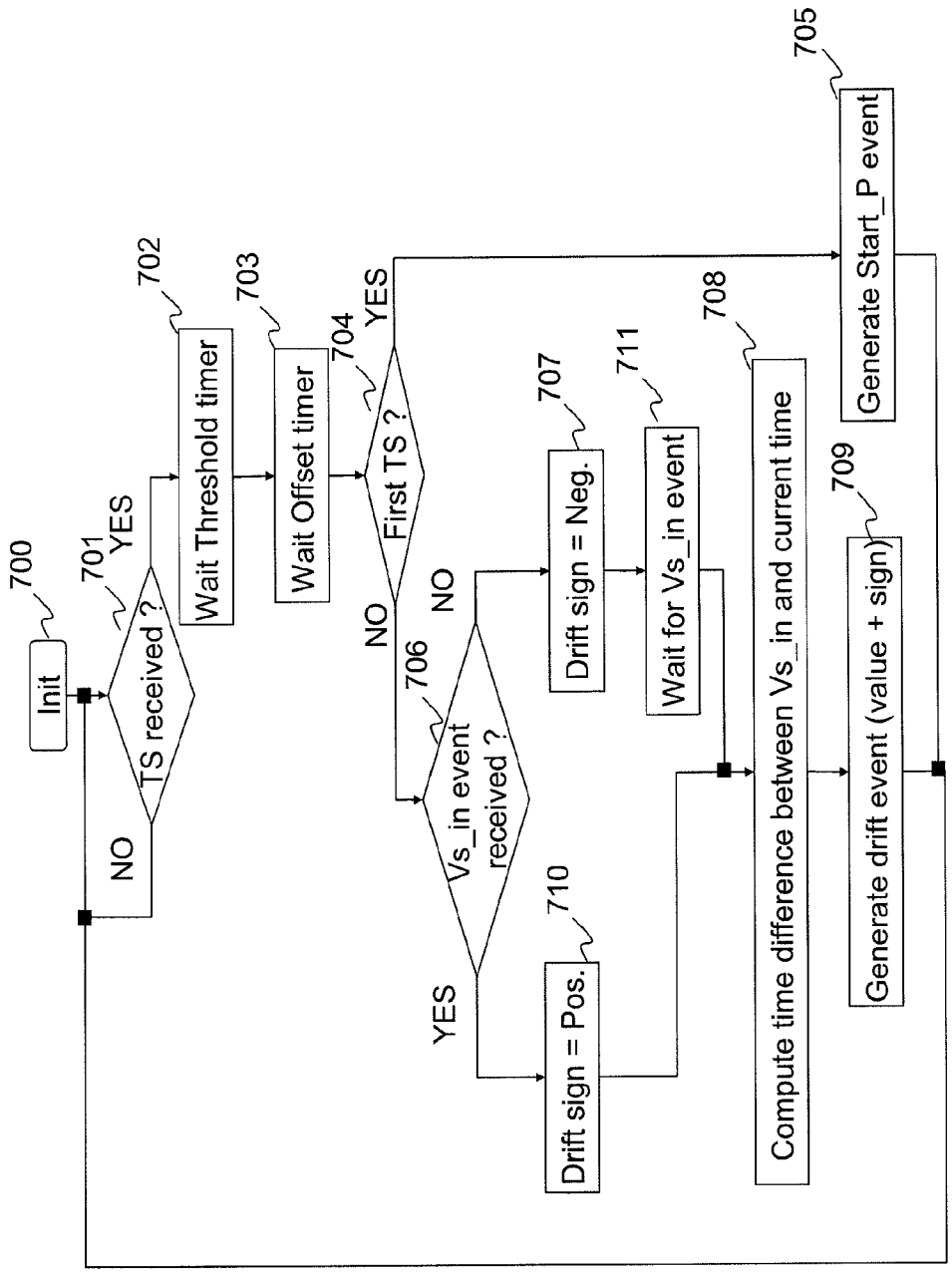
FIG. 8A is a flow chart illustrating steps of a method of calculating a local frame drift according to an embodiment of the invention.

FIG. 8A illustrates steps of an algorithm according to an embodiment of the invention implemented in local frame rate drift computing module 309 in display adapter architecture of FIG. 4C for the computation of a first drift value representative of a first time difference between a reference clock signal from video source device 102 and a local clock signal based on a local pixel clock signal of video display device 106. After an initialisation state 700, a wait is performed in step 701 until a TS event 306 representative of a reference clock signal of the video source device 102 is received.

Once a TS event 306 has been received, respective wait states 702 and 703 are applied until the current time equals the timing information contained in the TS timestamp value. This time stamp value reflects source adapter V_sync event plus a constant latency.

Indeed in steps 702 et 703 enable a V_sync image of the source based on the time stamp value TS to be locally generated at the display adapter 1061. The time stamp value TS is expressed with reference to a particular TDM index provided by the received TDM signal 302 and an offset generated by the offset timer in step 703. The threshold timer in step 702 indicates from which TDM index the offset will be applied. Thus the offset is applied with respect to the same timing reference as established by the access protocol of the TDM network.

Next, a test step 704 checks if the TS event was the first TS event following the initialisation state. If it is the case that it is the first TS event, i.e. during a start mode, a Start_p event is generated in step 705, to launch a post-processing process on the established stream, before returning to the wait state 701.

If it is not the case that the TS event is the first TS event, i.e. during drift tracking mode, a test step 706 is performed to check if the Vs_in event 317a, which corresponds to the start of locally generated frame, has already been received. The prior reception of a Vs_in event 317a is representative of a positive drift between the local frame rate and the source frame rate, i.e. the local frame rate is faster than the source frame rate. If it is the case that the Vs_in event has been received, a first drift event 310 is generated indicating that a positive drift is detected, and containing the time difference between the source frame start and local frame start, expressed as an integer number of Local_pixel_clk events, before returning to wait state 701. If it is not the case and the Vs_in event 317a has not been received, the drift is considered to be negative, and the wait state 711 is reached in order to wait for the next Vs_in event 317a. Once the Vs_in event is received, a first drift event 310 is generated indicating that a negative drift is detected, and containing the time difference between source frame start and the local frame start, expressed as an integer number of Local_pixel_clk periods, before returning to wait state 701.

Figure 8B:
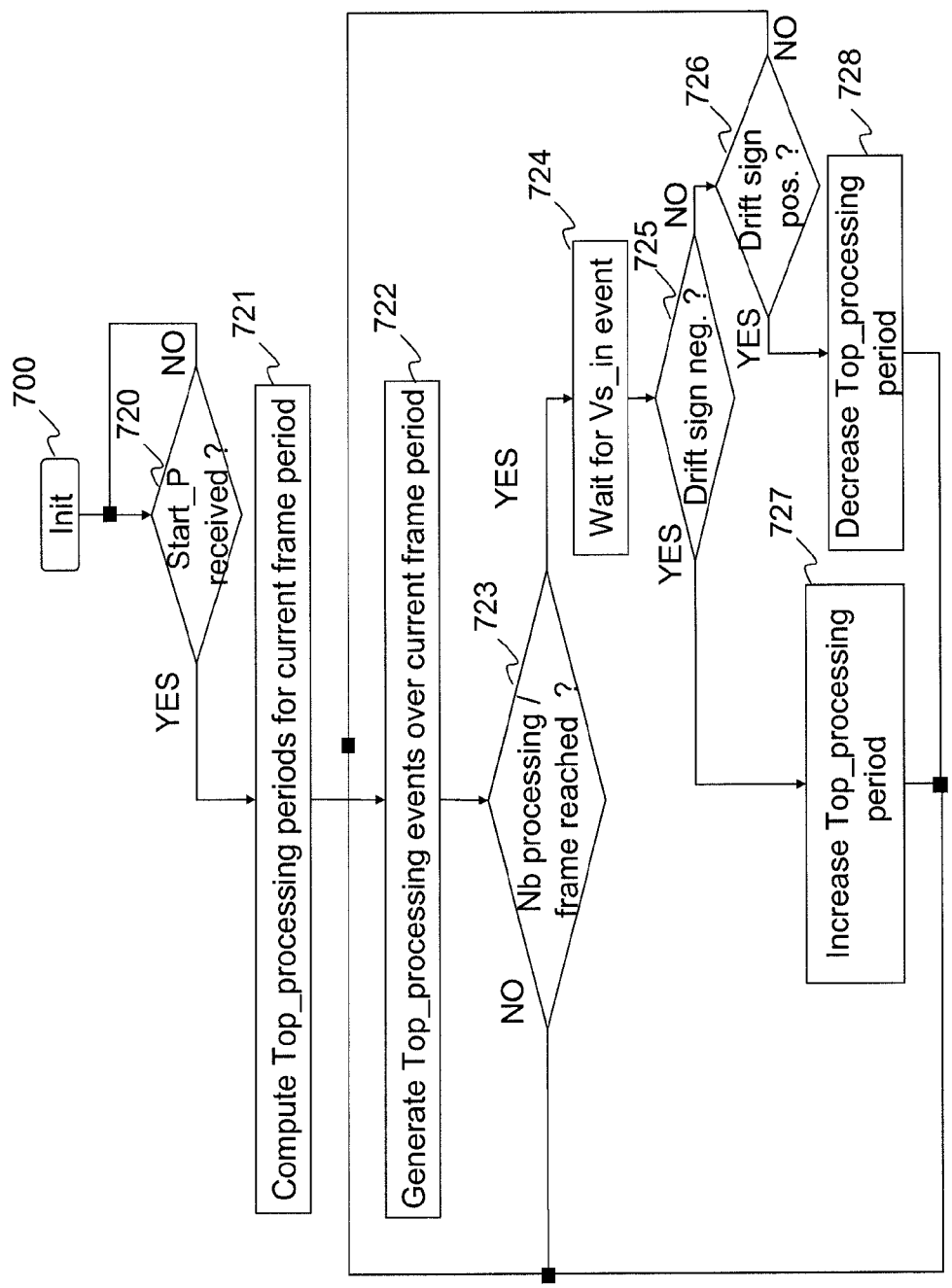
FIG. 8B is a flow chart illustrating steps of a method of adjusting a processing period according to an embodiment of the invention.

FIG. 8B illustrates steps of an embodiment of the algorithm implemented in processing period computing module 308 of the display adapter architecture of FIG. 4C. After an initialisation state 700, a wait is performed in step 720 until a Start_P event 330 is received. Once received, a post-processing period is computed in step 721 as an integer number of Local_pixel_Clk periods, the amount of processing to perform over a frame period being pre-determined, with respect to frame payload size and post-processing granularity. Post-processing is requested to the video data processor module 307 at every Top_processing 325 event, in step 722.

After each Top_processing event generation, a test step 723 is entered to check if the last event was the last processing iteration for the current frame. If it is not the case that the last event was the last processing iteration, a loop back to step 722 is done. If it is the case that the last event was the last processing iteration, a wait state 724 waits for the next Vs_in event 317*a*, indicative of the next local start of frame event. Once received, drift indication 310 is analyzed to check if a negative drift has been observed by module 309, in step 725. If yes, a negative drift has been observed the processing period is increased, by an amount expressed in integer number of Local_pixel_clock periods. As the drift value is not necessarily a multiple of the pre-defined number of processing periods to perform by frame, the drift correction will be spread over the different processing period for the next frame. This computation is done is step 727, before returning to step 722. If the drift is positive from test 726, the processing period shall be decreased, by an amount expressed in integer number of Local_pixel_clock periods. As the drift value is not necessary a multiple of the pre-defined number of processing periods to perform by frame, the drift correction will be spread over the different processing period for the next frame. This computation is done is step 728, before returning to step 722. If there is no drift, no modification of processing period occurs, and step 722 is returned to.

Start_D event 331 is generated to start local display processing in module 312, once a pre-determined number of post-processing has elapsed. This ensures that enough pixel data is available in buffer 311 before starting to write in display memory unit 319.

Figure 8C:
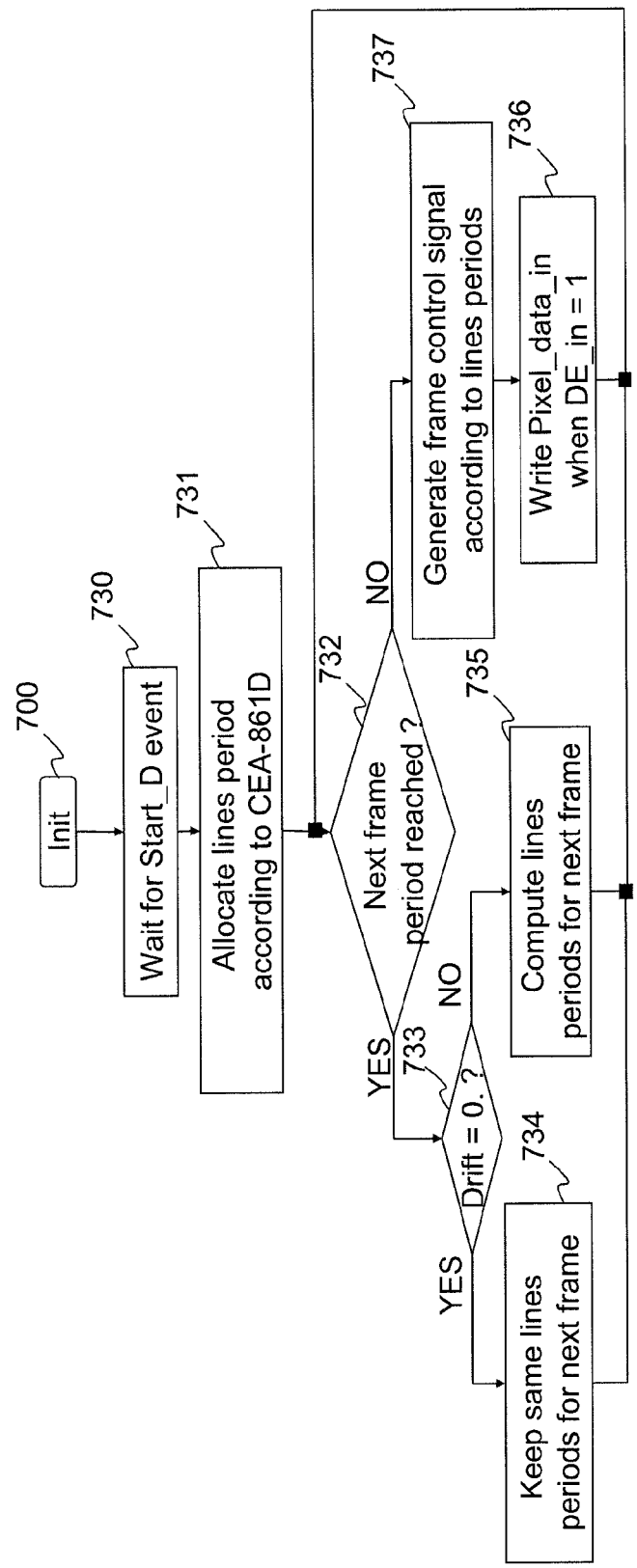
FIG. 8C is a flow chart illustrating steps of a method of displaying data according to an embodiment of the invention.

FIG. 8C illustrates steps of an embodiment of the algorithm implemented in display processing module 312 in display adapter architecture. After an initialisation state 700, a wait is performed in step 730 until a Start_D event 331 is received. Once a Start_D event 331 is received, a test step 732 is reached to check if the current frame period has elapsed. Until the current frame period has elapsed, generation of frame control signals Vs, Hs and DE follows in accordance with rules in step 737:

A HS event is generated at the beginning of each new line, and is active during Horizontal blanking period, corresponding to an integer number of Local_pixel_Clk period.

A Vs event is generated at the beginning of each frame, and is active during Vertical blanking period, corresponding to an integer number of lines periods.

DE is active during active display area, corresponding to an integer number of Local_pixel_Clk periods within the line period outside the vertical blanking period.

Pixel_Data_in content are retrieved from buffer 311 when DE is active, in step 736. For others Local_pixel_Clk periods, Pixel_Data_in values are undefined.

Just after Start_D event, the first frame is displayed applying CEA-861D timing standard. Upon a non null drift in test 733, line periods are modified in step 735 to either increase or decrease the next local frame period. These modifications are spread over the different lines of the frame, and affect horizontal blanking period durations, without modifying the active display area, i.e. DE periods. The vertical blanking periods may also be modified, by reducing or increasing the number of lines during the vertical blanking period of the next frame.

Figure 8D:
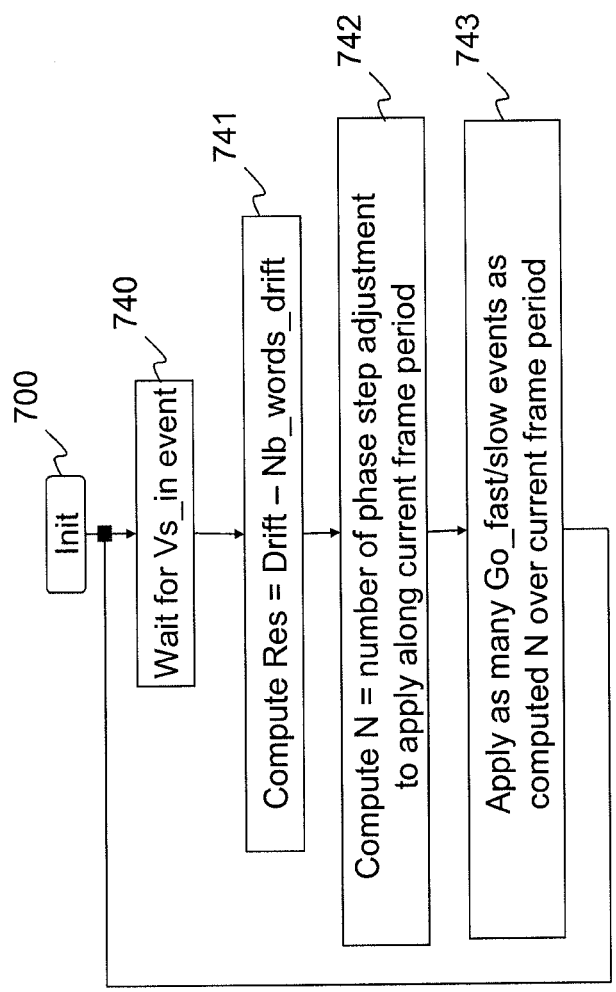
FIG. 8D is a flow chart illustrating steps of a method of comparing drift timing data according to an embodiment of the invention.

FIG. 8D illustrates steps of an algorithm implemented in the PLL management module 3314 in display adapter architecture. After an initialisation state 700, a wait is performed in step 740 until a Vs_in event 317*a* is received Once a Vs_in event 317*a* is received, in step 741 the remaining drift existing between the drift value 310 provided by module 309, and drift information Nb_words_drift 315 returned by unit 319 is computed. This computation is carried out, to compare the difference between the drift correction already applied internally on the local frame management processing and display (in modules 309, 308 and 312) and the relative timing observed on external video frame delivery, synchronous to PLL's variations. According to the PLL's implementation, the expected difference is not predictable, and should consequently be measured and integrated for the next PLL's adjustment period.

Many further modifications and variations will suggest themselves to those versed in the art upon making reference to the foregoing illustrative embodiments, which are given by way of example only and which are not intended to limit the scope of the invention, that being determined solely by the appended claims. In particular the different features from different embodiments may be interchanged, where appropriate.

The invention claimed is:

1. A device for regenerating a pixel clock signal, the device comprising:
   first drift means for determining a first drift value representative of a first time difference between a reference clock signal and a local clock signal based on a local pixel clock signal;
   an adjustable clock generator for receiving the local pixel clock signal at an input and outputting a regenerated pixel clock signal according to the local pixel clock signal and a received adjustment command;
   second drift means for determining a second drift value representative of a second time difference between the reference clock signal and a regenerated clock signal based on the regenerated pixel clock signal; and
   an adjustment unit for receiving the first drift value and the second drift value and operable to provide the adjustment command to the adjustable clock generator for adjusting the regenerated pixel clock signal, wherein the adjustment command is based on the difference between the determined first and second drift values.

2. The device according to claim 1, wherein the first drift value and the second drift value are each expressed as a number of local pixel clock cycles.

3. The device according to claim 1, wherein the local clock signal is representative of a local frame rate of video data of a display device receiving the video data, and the reference clock signal is representative of a source frame rate of video data of a source device supplying the video data.

4. The device according to claim 1, wherein the adjustable clock generator is a phase locked loop device having a step phase adjustable capability responsive to the adjustment command for adjusting the time duration between rising or falling edges of the regenerated pixel clock signal.

5. The device according to claim 1 further comprising processing period modification means for modifying a video data processing period according to the first drift value.

6. The device according to claim 1 further comprising local frame period modification means for modifying the period of a local frame of video data of the display device according to the first drift value.

7. The device according to claim 1 wherein the second drift means is operable to determine the second drift value based on the difference a number of pixels of video data written by a display processing module and the number of pixels provided to a video display device over each video frame period.

8. A video display apparatus for receiving video data from a remote source for display on a local display, the apparatus comprising
- a display device for displaying video data pixel by pixel at a rate in accordance with a regenerated pixel clock signal; and
- a device according to claim 1 for providing the regenerated pixel clock signal to the display device.

9. A method of regenerating a pixel clock signal, the method comprising:
- determining a first drift value representative of a first time difference between a reference clock signal and a local clock signal based on a local pixel clock signal;
- adjusting the local pixel clock signal according to an adjustment command to provide a regenerated pixel clock signal;
- determining a second drift value representative of a second time difference between the reference clock signal and a regenerated clock signal based on the regenerated pixel clock signal; and
- providing the adjustment command to the adjustable clock generator for adjusting the regenerated pixel clock signal, wherein the adjustment command is based on the difference between the determined first and second drift values.

10. The method according to claim 9, wherein the first drift value and the second drift value are each expressed as a number of local pixel clock cycles.

11. The method according to claim 9, wherein the local clock signal is representative of a local frame rate of video data of a display device receiving the video data, and the reference clock signal is representative of a source frame rate of video data of a source device supplying the video data.

12. The method according to claim 9, wherein the regenerated pixel clock signal is adjusted using a phase locked loop device having a step phase adjustable capability responsive to the adjustment command for adjusting the time duration between rising or falling edges of the regenerated pixel clock signal.

13. The method according to claim 9 further comprising modifying a video data processing period according to the first drift value.

14. The method according to claim 9 further comprising modifying the period of a local frame according to the first drift value.

15. The method according to claim 9 wherein the second drift value is determined based on the difference a number of pixels of video data written by a display processing module and the number of pixels provided to a video display device over each video frame period.

* * * * *